United States Patent
Song et al.

(10) Patent No.: US 12,074,209 B2
(45) Date of Patent: Aug. 27, 2024

(54) SENSOR-LESS OVERCURRENT FAULT DETECTION USING HIGH ELECTRON MOBILITY TRANSISTORS

(71) Applicant: ABB Schweiz AG, Baden (CH)

(72) Inventors: Xiaoqing Song, Apex, NC (US); Utkarsh Raheja, Raleigh, NC (US); Pietro Cairoli, Cary, NC (US); Jing Xu, Cary, NC (US)

(73) Assignee: ABB SCHWEIZ AG, Baden (CH)

( * ) Notice: Subject to any disclaimer, the term of this patent is extended or adjusted under 35 U.S.C. 154(b) by 485 days.

(21) Appl. No.: 17/468,831

(22) Filed: Sep. 8, 2021

(65) Prior Publication Data

US 2023/0074777 A1 Mar. 9, 2023

(51) Int. Cl.
*H02M 1/32* (2007.01)
*H01L 29/20* (2006.01)
*H01L 29/66* (2006.01)
*H01L 29/778* (2006.01)
*H02H 3/08* (2006.01)
*H03K 17/0812* (2006.01)

(52) U.S. Cl.
CPC .... *H01L 29/66462* (2013.01); *H01L 29/2003* (2013.01); *H01L 29/778* (2013.01); *H02H 3/08* (2013.01); *H02M 1/32* (2013.01); *H03K 17/08122* (2013.01); *H03K 2217/0027* (2013.01)

(58) Field of Classification Search
CPC .............. H02M 1/32; H03K 17/08122; H03K 2217/0027; H02H 3/08
See application file for complete search history.

(56) References Cited

U.S. PATENT DOCUMENTS

| 8,278,997 | B1 * | 10/2012 | Kim | G06F 1/26 327/541 |
| 8,422,182 | B2 | 4/2013 | Boudet et al. | |
| 10,276,321 | B2 | 4/2019 | Kennedy et al. | |

(Continued)

FOREIGN PATENT DOCUMENTS

| CN | 108508342 A | 9/2018 | |
| CN | 108508342 B * | 7/2020 | ......... G01R 31/2608 |

(Continued)

OTHER PUBLICATIONS

Extended European Search Report for European Application No. 22194414.3, dated Mar. 2, 2023, 8 pages.

*Primary Examiner* — Kyle J Moody
*Assistant Examiner* — Jye-June Lee
(74) *Attorney, Agent, or Firm* — McCarter & English, LLP

(57) ABSTRACT

An overcurrent fault detector using a High Electron Mobility Transistor (HEMT) operated by a gate driver is disclosed. The overcurrent fault detector includes a band-pass filter and a control circuit. The band-pass filter is configured to receive gate-to-source voltage (VGS) signals of the HEMT and filter the VGS signals to generate a band-limited version of the VGS signals. The control circuit is configured to measure a value of the band-limited version of the VGS signals, determine if the value is greater than a threshold value, and generate a fault signal that disables the gate driver and terminates an overcurrent fault condition in response to determining that the value is greater than the threshold value.

20 Claims, 6 Drawing Sheets

(56) References Cited

U.S. PATENT DOCUMENTS

| | | | |
|---|---|---|---|
| 11,531,054 B2* | 12/2022 | Kwon | H02H 3/08 |
| 2010/0277006 A1 | 11/2010 | Urciuoli | |
| 2014/0085762 A1* | 3/2014 | Shimano | H02M 1/32 |
| | | | 361/91.6 |
| 2016/0118891 A1* | 4/2016 | Hashimoto | H02M 1/32 |
| | | | 323/271 |
| 2019/0103742 A1 | 4/2019 | Kennedy et al. | |
| 2019/0140630 A1* | 5/2019 | Chen | H03K 17/0822 |
| 2020/0212906 A1 | 7/2020 | Mukunoki | |
| 2022/0190528 A1* | 6/2022 | Arduini | H01R 13/7038 |

FOREIGN PATENT DOCUMENTS

| | | | |
|---|---|---|---|
| CN | 111835183 A | | 10/2020 |
| DE | 4313882 C1 | | 8/1994 |
| EP | 0197658 A2 | | 10/1986 |
| EP | 0272898 A2 | | 6/1988 |
| JP | 2015103939 A | * | 6/2015 |
| JP | 2018050157 A | * | 3/2018 |
| JP | 2018129869 A | * | 8/2018 |

\* cited by examiner

SENSOR-LESS OVERCURRENT FAULT DETECTION USING HIGH ELECTRON MOBILITY TRANSISTORS

BACKGROUND

The field of the disclosure relates to solid-state switches, and more particularly, to detecting overcurrent fault conditions using High Electron Mobility Transistors (HEMTs).

A HEMT is a field-effect transistor that incorporates a junction between two materials with different band gaps as the channel, rather than a doped region (as is generally the case for a Metal Oxide Semiconductor Field Effect Transistor (MOSFET)). HEMTs have exceptional carrier mobility and provide enhanced switching speed as compared to MOSFETs.

Typical current sensing circuits for solid-state switches may utilize a current sensing resistor or current sensors in a current path for the Field Effect Transistor (FET), with amplifier circuits measuring a differential voltage across the current sensing resistor in order to detect overcurrent conditions at the FET. However, as applications move towards more compact system solutions with increased use of power converters, fault time constraints are becoming shorter. With the limited overcurrent capability of HEMT devices, it is desirable to ensure safe operation of the HEMT device and limit the fault energy in the application by implementing fast fault detection and fault termination, thereby necessitating the use of high-bandwidth current sensing solutions. However, high-bandwidth current sensing solutions increase the cost associated with protection circuits for HEMTs, which is undesirable.

Thus, it is desirable to detect current faults for circuits that utilize HEMTs without resorting to the use of high-bandwidth current sensing solutions, which can increase the cost of the protection circuits.

BRIEF DESCRIPTION

In one aspect, an overcurrent fault detector using a High Electron Mobility Transistor (HEMT) operated by a gate driver is disclosed. The overcurrent fault detector includes a band-pass filter and a control circuit. The band-pass filter is configured to receive gate-to-source voltage (VGS) signals of the HEMT and filter the VGS signals to generate a band-limited version of the VGS signals. The control circuit is configured to measure a value of the band-limited version of the VGS signals, determine if the value is greater than a threshold value, and generate a fault signal that disables the gate driver and terminates an overcurrent fault condition in response to determining that the value is greater than the threshold value.

In another aspect, a method of detecting an overcurrent fault using a High Electron Mobility Transistor (HEMT) operated by a gate driver is disclosed. The method includes receiving gate-to-source voltage (VGS) signals of the HEMT, filtering the VGS signals to generate a band-limited version of the VGS signals, measuring a value of the band-limited version of the VGS signals, determining if the value is greater than a threshold value, and generating a fault signal that disables the gate driver and terminates an overcurrent fault condition in response to determining that the value is greater than the threshold value.

In yet another aspect, a solid-state circuit breaker for an Alternating Current (AC) power system is disclosed. The solid-state circuit breaker includes a line input connector, a line output connector, a High Electron Mobility Transistor (HEMT), a gate driver, a band-pass filter, and a control circuit. The HEMT includes a gate, a drain, and a source, where the drain and the source selectively form a conduction path between the line input connector and the line output connector based on a drive signal applied between the gate and the source. The gate driver is configured to generate the drive signal based on the gate command signal. The band-pass filter is configured to receive gate-to-source voltage (VGS) signals of the HEMT and filter the VGS signals to generate a band-limited version of the VGS signals. The control circuit is configured to measure a value of the band-limited version of the VGS signals, determine if the value is greater than a threshold value, and generate a fault signal that disables the gate driver and terminates an overcurrent fault condition in response to determining that the value is greater than the threshold value.

DRAWINGS

These and other features, aspects, and advantages of the present disclosure will become better understood when the following detailed description is read with reference to the accompanying drawings in which like characters represent like parts throughout the drawings, wherein.

Figure 1:
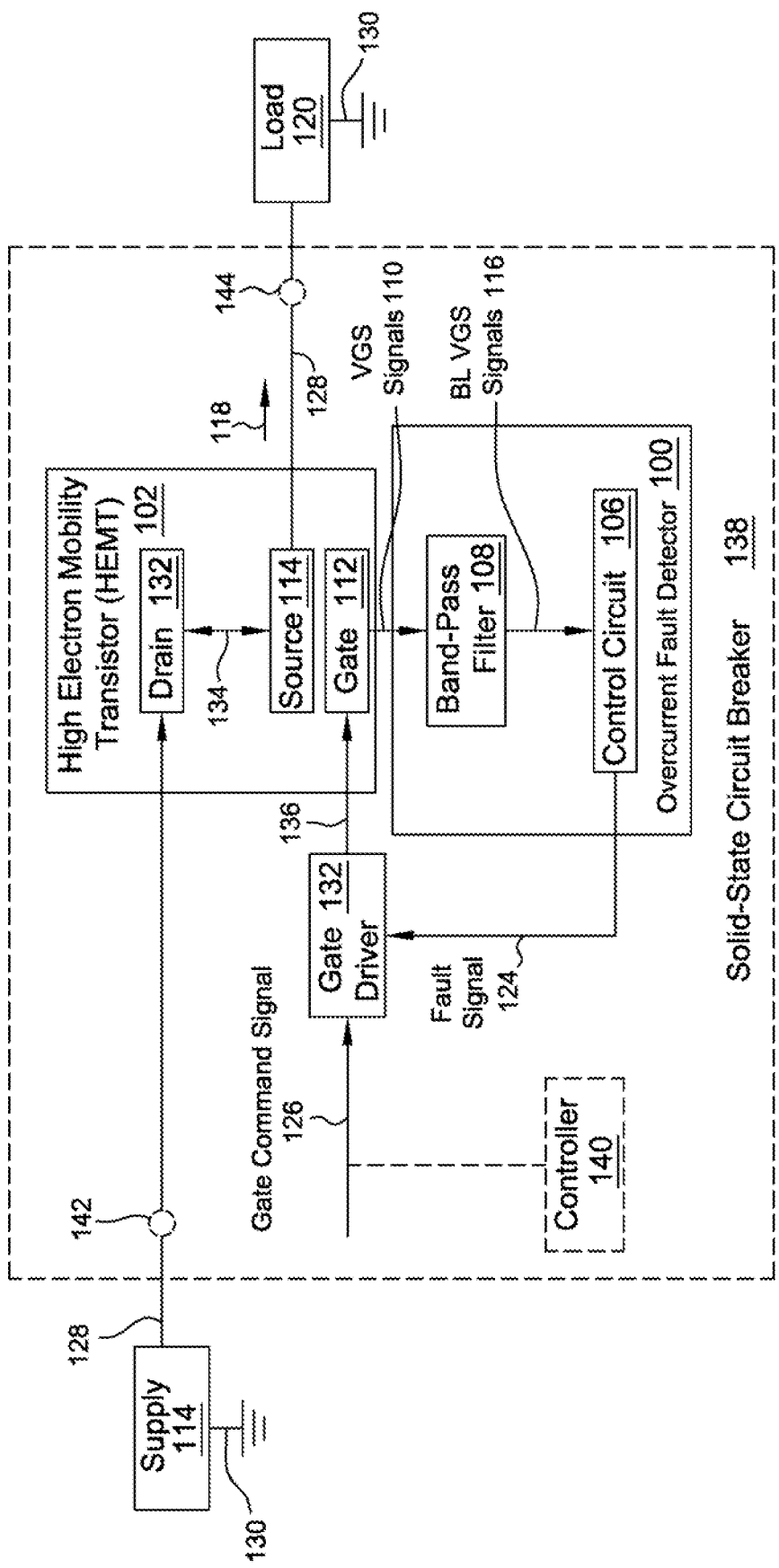
FIG. 1 is a block diagram of an overcurrent fault detector using a HEMT in an example embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

FIG. 1 is a block diagram of an overcurrent fault detector 100 using a High Electron Mobility Transistor (HEMT) 102 operated by a gate driver 104 in an example embodiment. In this embodiment, the fault detector 100 includes a control circuit 106 and a band-pass filter 108. The control circuit 106 includes any component, system, or device that implements the functions described herein for the control circuit 106. In this regard, the control circuit 106 may include additional logic devices and analog circuits not specifically shown or described herein.

The band-pass filter 108 includes any component, system, or device that filters signals. In this embodiment, the band-pass filter 108 receives, as an input, gate-to-source voltage (VGS) signals 110 representative of a voltage differential between a gate 112 of the HEMT 102 and a source 114 of the HEMT 102, and filters the VGS signals 110 to generate band-limited VGS signals 116 (e.g., band-limited VGS signals 116 are a band-limited version of the VGS signals 110) as an output. In some embodiments, the bandwidth of the band-pass filter 108 includes a center frequency from about 100 Megahertz (MHz) to about 300 MHz and a pass-band frequency from about 10 MHz to about 50 MHz around the center frequency.

The band-limited VGS signals 116 are provided to the control circuit 106 for analysis. During an overcurrent fault condition, such as when a current 118 supplied to a load 120 from a supply 122 has a high enough value to cause an overcurrent condition at the HEMT 102, the VGS signals 110 from the gate 112 of the HEMT 102 exhibit a characteristic oscillation. Generally, the characteristic oscillation may have a frequency from about one hundred MHz to about two hundred MHz. The control circuit 106 measures a value of this characteristic oscillation generated from the HEMT 102 during the overcurrent fault condition, determines if the value exceeds a threshold value, and generates a fault signal 124 when the value exceeds the threshold value. The fault signal 124 disables the gate driver 104 and terminates the overcurrent fault regardless of the logical state of a gate command signal 126 applied to the gate driver 104.

In this embodiment, the overcurrent fault detection occurs without current sensors in the current path between the supply 122 and the load 120 and/or without or other types of inductive current sensing circuits that may be used to determine the current 118, which facilitates the detection of the overcurrent fault conditions without resorting to the use of high-bandwidth current sense circuits, thereby providing a technical benefit in the art.

In this embodiment, the gate driver 104 selectively turns the HEMT 102 on or off based on the gate command signal 126 in order to selectively couple a supply path 128 between the supply 122 and the load 120 and provide the current 118 to the load 120. In one embodiment, the HEMT 102 is one device of a plurality of devices that operate as part of a solid-state circuit breaker (SSCB) 138 between the supply 122 and the load 120, and the gate command signal 126 may be generated by a controller 140 of the SSCB 138. In this embodiment, the supply 122 is electrically coupled to the SSCB 138 at a line input connector 142, and the load 120 is electrically coupled to the SSCB 138 at a line output connector 144. Thus, in one embodiment, the supply 122 provides Alternating Current (AC) electrical power to the load 120, and the supply path 128 is a line conductor. In another embodiment, the supply 122 provides Direct Current (DC) electrical power to the load 120, and the supply path 128 is a DC power conductor.

In this embodiment, the supply 122 and the load 120 are electrically coupled via a return path 130 for the current 118. The return path 130 includes a neutral conductor in embodiments where the supply 122 provides AC electrical power to the load 120 and a ground conductor in embodiments where the supply 122 provides DC electrical power to the load 120. In FIG. 1, the current 118 is depicted having a particular direction, but the principles described herein for the fault detector 100 apply equally to when the current 118 is reversed. The current 118 is an AC current or a DC current in different embodiments.

In this embodiment, the supply 122 is coupled to a drain 132 of the HEMT 102, and the load 120 is coupled to the source 114 of the HEMT 102 for purposes of discussion. In this configuration, the drain 132 and the source 114 selectively form a conduction path between the line input connector 142 and the line output connector 144. The HEMT 102 depicted in FIG. 1 may have other configurations in other embodiments. In this embodiment, the HEMT 102 is a normally-off device, although the HEMT 102 is a normally-on device in other embodiments. In embodiments where the HEMT 102 is a normally-off device, the HEMT 102 may include an enhancement mode HEMT, a Gate Injection Transistor, or have a "cascode" configuration whereby the HEMT 102 is packaged with a normally-off MOSFET to convert a normally-on HEMT to a normally-off HEMT.

HEMTs operate based on the presence of a two-dimensional electron gas (2DEG) or a two-dimensional hole gas (2DHG) within the device, which forms based on two semiconductors in the HEMT 102 that have different band gaps. The presence of the 2DEG or the 2DHG forms a conduction channel 134 in the HEMT 102 that is bidirectional in this embodiment and facilitates a current flow between the drain 132 and the source 114 of the HEMT 102 (e.g., the conduction channel 134 facilitates the current 118 flowing between the supply 122 and the load 120). The use of two semiconductor materials in the HEMT 102 that have different band gaps is referred to as a heterojunction. In some embodiments, the heterojunction for the HEMT 102 is formed from gallium nitride (GaN) and aluminum gallium arsenide AlGaAs, although GaN may be combined with other semiconductor materials in other embodiments. Generally, the heterojunction for the HEMT 102 may be formed from any two semiconductor materials that have different band gaps. In some embodiments, HEMT 102 is a GaN Gate Injection Transistor (GIT) HEMT.

During normal operation, the gate driver 104 receives the gate command signal 126 (e.g., from the controller 140), and the gate driver 104 applies a drive signal 136 to the gate 112 of the HEMT 102 based on the gate command signal 126. For example, if the gate command signal 126 directs the gate driver 104 to turn the HEMT 102 on, then the gate driver 104, in the configuration for the HEMT 102 depicted in FIG. 1, generates the drive signal 136 to bias the gate 112 with respect to the source 114 above a turn-on voltage for the HEMT 102, which forms the conduction channel 134 and electrically couples the supply 122 with the load 120. In embodiments where the HEMT 102 is a Gate Injection Transistor (GIT) HEMT, then the gate driver 104 additionally provides a current to the gate 112 of the HEMT 102 to maintain the conduction channel 134.

In continuing with the example, if the gate command signal 126 directs the gate driver 104 to turn the HEMT 102 off, then the gate driver 104, in the configuration for the HEMT 102 depicted in FIG. 1, generates the drive signal 136 to bias the gate 112 with respect to the source 114 below the turn-on voltage for the HEMT 102 (and/or terminates the current provided to the gate 112 when the HEMT 102 is a GIT HEMT), which terminates the conduction channel 134 and electrically decouples the supply 122 from the load 120, thereby disconnecting the input line connector 142 from the line output connector 144.

In an overcurrent fault condition, the magnitude of the current 118 can quickly increase due to shorts at the load side of FIG. 1 (e.g., shorts between the supply path 128 and the return path 130 at the load 120) or other conditions, which are quickly detected by the fault detector 100 by sensing a characteristic oscillation at the gate 112 of the HEMT 102 and terminating the fault condition using the fault signal 124 applied to the gate driver 104. This will be discussed in more detail below.

In FIG. 1, the overcurrent fault detection is a sensor-less design, as the characteristic oscillation present at the gate 112 of the HEMT 102 during overcurrent fault conditions is detectable without the use of additional current sensors or inductive circuits for measuring the current 118. In this embodiment, the fault detector 100 operates to detect and terminate the overcurrent fault condition within a few microseconds, thereby mitigating the overcurrent fault condition quickly. This type of response time is difficult to achieve in typical current sense circuits without resorting to the use of high-bandwidth devices, which would increase the cost associated with detecting and mitigating the overcurrent fault conditions.

Figure 2:
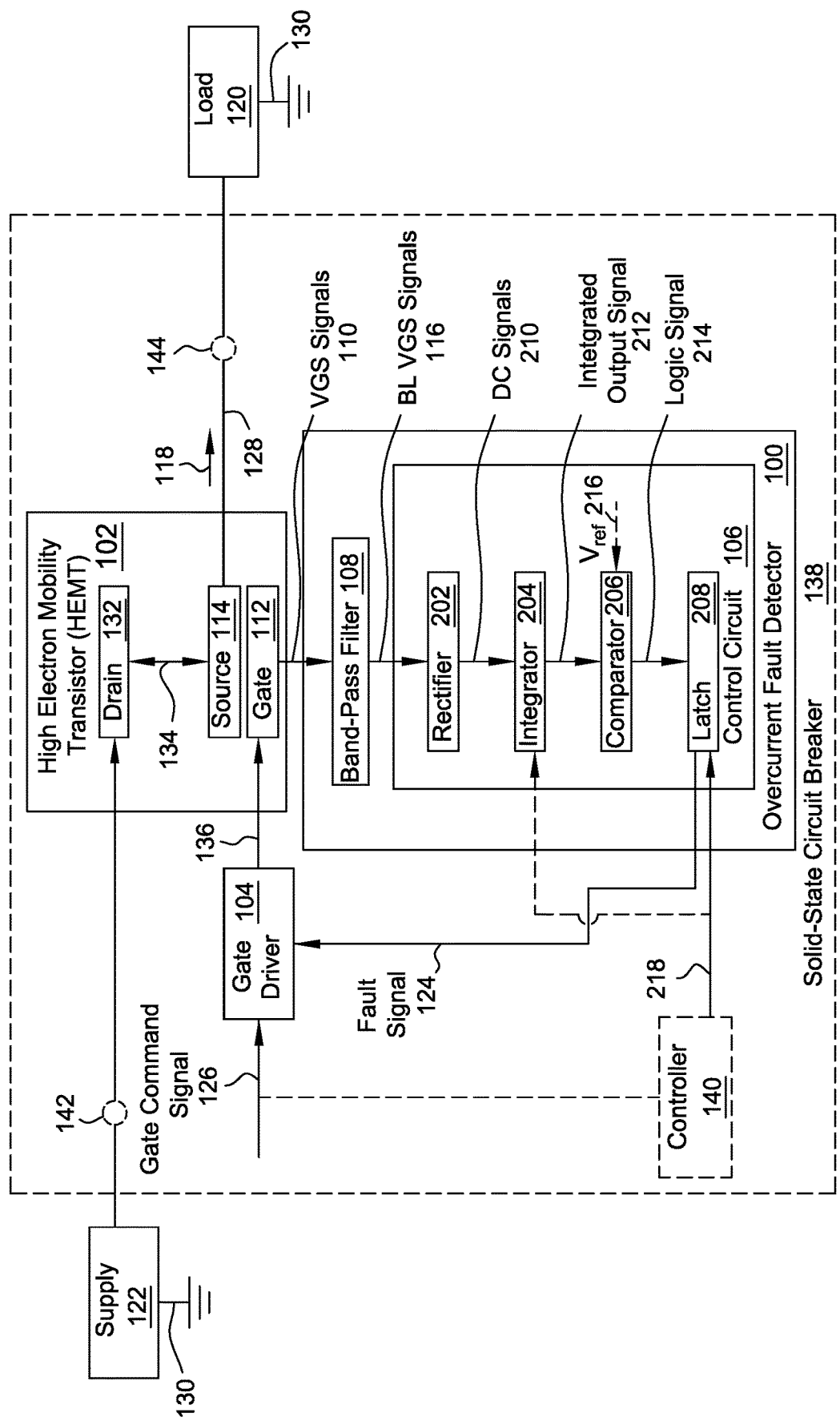
FIG. 2 is a block diagram of the overcurrent fault detector of FIG. 1 in another example embodiment.

FIG. 2 is a block diagram of the fault detector 100 in another example embodiment. In this embodiment, the control circuit 106 includes a series of devices that form an overcurrent fault detection and control path for the control circuit 106. The overcurrent fault detection and control path receives the band-limited VGS signals 116 from the band-pass filter 108 and generates the fault signal 124 when appropriate. In this embodiment, the overcurrent fault detection and control path for the control circuit 106 include a rectifier 202, an integrator 204, a comparator 206, and a latch 208. The rectifier 202 includes any component, system, or device that receives the band-limited VGS signals 116 from the output of the band-pass filter 108 and generates DC signals 210 at its output for the integrator 204. Generally, the output of the band-pass filter 108 is an AC signal (e.g., a bidirectional signal) and the rectifier 202 converts the bidirectional signal from the band-pass filter 108 to unidirectional signals. The integrator 204 includes any component, system, or device that receives the DC signals 210 from the output of the rectifier 202 and integrates the DC signals 210 over a time frame to generate an integrated output signal 212. For example, the DC signals 210 may include a half-wave rectified output from the band-pass filter 108 with a zero-volt DC offset, and the integrator 204 performs an integration process over the time frame to generate the integrated output signal 212. In some embodiments, the time frame is controlled or reset by a reset signal 218 that is selectively applied to the control circuit 106 (e.g., via the controller 140). The time frame may also be referred to as an integration time in some embodiments.

In this embodiment, the comparator 206 of the control circuit 106 includes any component, system, or device that receives the integrated output signal 212 from the integrator 204 and generates a logic signal 214 based the difference between the integrated output signal 212 and a reference voltage 216. For example, if the integrated output signal 212 is greater than the reference voltage 216, then the comparator 206, in one embodiment, generates the logic signal 214 to have a logic high value. In continuing with the example, in this embodiment, if the integrated output signal 212 has a magnitude that is less than the reference voltage 216, then the comparator 206 generates the logic signal 214 to have a logic low value.

The logic signal 214 is applied to the latch 208 in this embodiment. The latch 208 of the control circuit 106 includes any component, system, or device that receives the logic signal 214 from the comparator 206 and generates the fault signal 124 based on the logic signal 214. In this embodiment, the fault signal 124 continues to be asserted by the latch 208 until the reset signal 218 is received by the control circuit 106 (e.g., from the controller 140). This allows the controller 140 or another device to perform a fault recovery process before clearing the latch 208 with the reset signal 218, which clears an asserted state of the fault signal 124.

Figure 3:
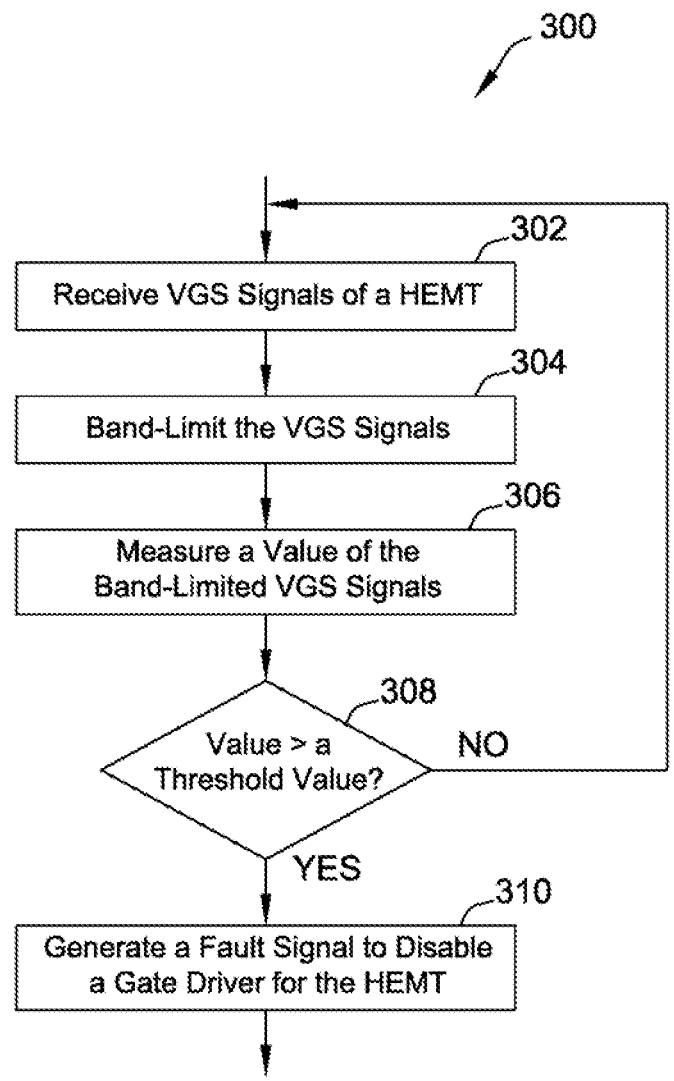
FIG. 3 is a flow chart of a method of detecting overcurrent faults using a HEMT in an example embodiment.
Figure 4:
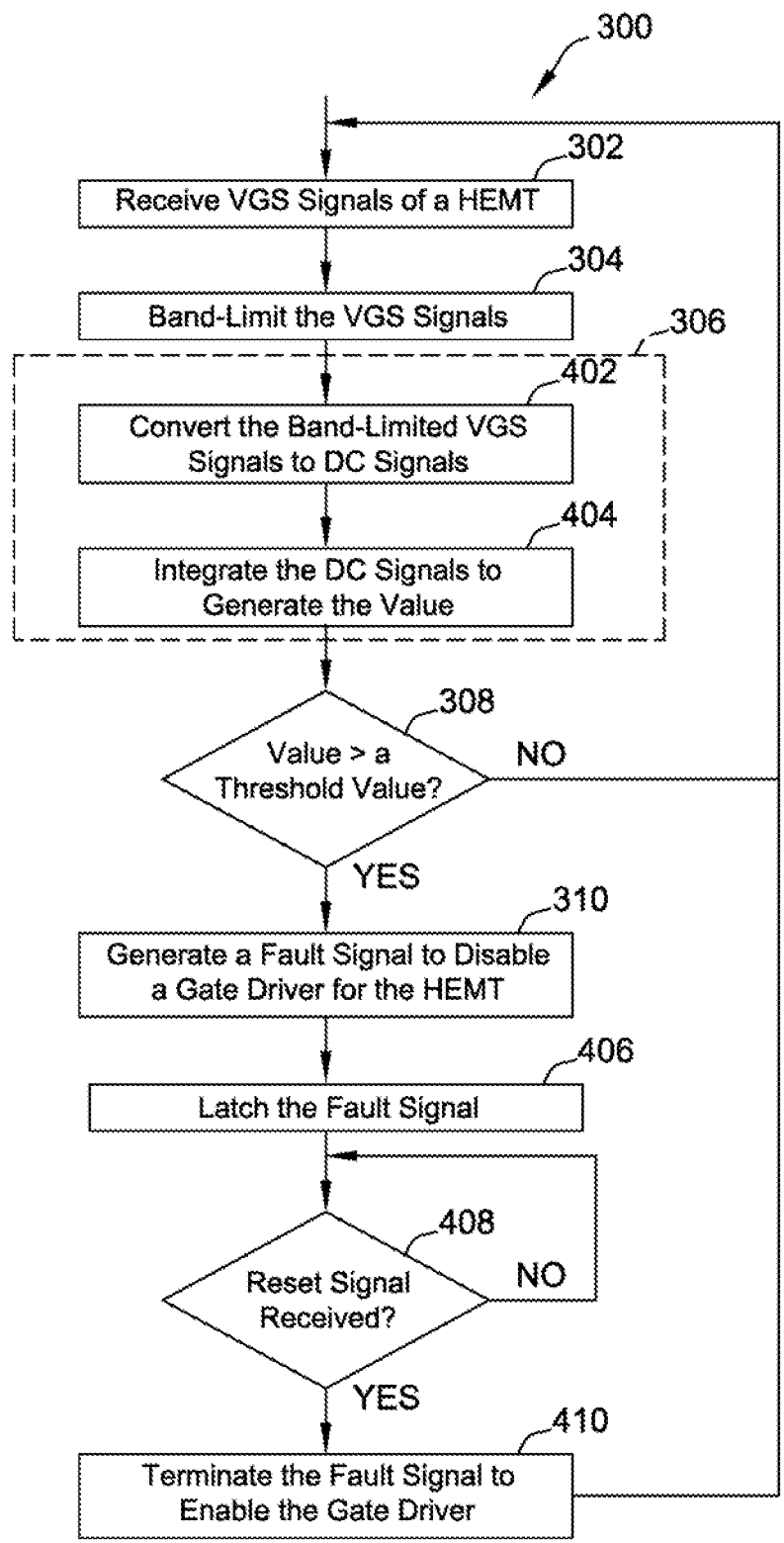
FIG. 4 is a flow chart depicting additional details of the method of FIG. 3 in an example embodiment.

FIG. 3 is a flow chart of a method 300 of detecting an overcurrent fault condition using a HEMT operated by a gate driver in an example embodiment, and FIG. 4 depicts additional details of the method 300 in an example embodiment. The method 300 will be discussed with respect to the fault detector 100 depicted in FIGS. 1 and 2, but the method 300 may apply to other systems not specifically shown or described herein. The steps of the method 300 are not all inclusive, and the method 300 may include other steps different from those shown or described herein. Further, the steps of the method 300 may be performed in a different order.

Consider that SSCB 138 (see FIG. 1) is installed at a premise location, that the SSCB 138 is operating as a solid-state circuit breaker between the supply 122 and the load 120, and that the supply 122 is currently providing a non-zero current 118 for the load 120. The load 120 may be, for example, a household appliance. The gate 112 of the HEMT 102 generates VGS signals 110, which are received by the band-pass filter 108 of the fault detector 100 (see 302). Generally, the VGS signals 110 from the HEMT 102 will have an AC signal component of about zero when no overcurrent fault condition is present and will have a characteristic oscillation (e.g., between about 100 MHz and 200 MHz, depending on the device characteristics of the HEMT 102) when an overcurrent fault condition is present.

The VGS signals 110 received by the fault detector 100 from the HEMT 102 are band-limited to suppress signals outside of the characteristic oscillation frequency of the HEMT 102, and the band-limited VGS signals 116 from the output of the band-pass filter 108 are applied to the control circuit 106 for analysis (see 304). The control circuit 106 measures a value of the band-limited VGS signals 116 (see 306) and determines if the value is greater than a threshold value (see 308). In some cases, the value is less than the threshold value, and processing returns to block 302. For example, the value is less than the threshold value when the characteristic AC signal at the gate 112 of the HEMT 102 is not present, which indicates that no overcurrent fault condition is present.

In some cases, the values of the band-limited VGS signals 116 measured by the control circuit 106 are greater than the threshold value. For example, during an overcurrent fault at the load 120, the magnitude of the current 118 quickly reaches a high level, which may cause the junction temperature in the HEMT 102 to quickly rise and exceed its thermal design specification due to the magnitude of the current 118 flowing through the conduction channel 134 of the HEMT 102. The differential voltage across the gate 112 and the source 114 begins oscillating at a characteristic frequency (e.g., a frequency from about 100 MHz to about 200 MHz) in response to the thermal overload, which is reflected in the VGS signals 110 at the gate 112 and applied to the band-pass filter 108. In this overcurrent fault condition, the value measured by the control circuit 106 is greater than the threshold value, and the control circuit 106 generates the fault signal 124 to disable the gate driver 104 at the HEMT 102 (see 310). The fault signal 124 overrides the gate command signal 126 for the gate driver 104, and the gate driver 104 turns off the HEMT 102 and terminates the overcurrent fault condition.

Referring to FIG. 2 and FIG. 4, when the HEMT 102 is operating normally, the gate driver 104 receives the gate command signal 126 (e.g., from the controller 140) and applies the drive signal 136 to the gate 112 of the HEMT 102 to turn the HEMT 102 on, and the current 118 flows between the supply 122 and the load 120 through the conduction channel 134 of the HEMT 102. The band-pass filter 108 of the fault detector 100 receives the VGS signals 110 from the gate 112 of the HEMT (see 302, previously described).

If the current 118 rises quickly due to a overcurrent fault condition, the VGS signals 110 from the gate 112 begin to oscillate at a characteristic frequency (e.g., an AC signal having a frequency of about 150 MHz+/–about 50 MHz), which is band-limited by the band-pass filter 108 (see 304 of FIG. 4, previously described). The band-limited VGS signals 116 are applied to the rectifier 202 of the control circuit 106. The rectifier 202, upon receiving the band-limited VGS signals 116 at its input from the band-pass filter 108, generates the DC signals 210 at its output (see 402 of FIG. 4). The DC signals 210 may include, for example, a half-wave rectified output of the band-limited VGS signals 116, having a DC offset about zero. The integrator 204 integrates the DC signals 210 (see 404) and applies its integrated output signal 212 to the comparator 206. The comparator 206 performs a comparison of the integrated output signal 212 with the threshold value represented by the reference voltage 216 and generates the logic signal 214 for the latch 208 based on the comparison. If for example, the integrated output signal 212 is greater than the reference voltage 216, then the logic signal 214 generated by the comparator 206 causes the latch 208 to generate and latch the fault signal 124 (see 406), which is applied to the gate driver 104. The fault signal 124 overrides the gate command signal 126 at the gate driver 104, causing the gate driver 104 to turn off the HEMT 102 and terminate the overcurrent fault condition. The fault signal 124 is latched by the latch 208 and continues to assert the fault signal 124 until the reset signal 218 is applied to the latch 208 (e.g. by the controller 140, see 408), which resets the integration time frame for the integrator 204 and clears the latch 208. Clearing the latch 208 terminates the fault signal 124 (see 410), allowing the control circuit 106 to perform another analysis based on the VGS signals 110 from the gate 112 of the HEMT 102 to determine if the overcurrent fault condition is still present.

Figure 5:
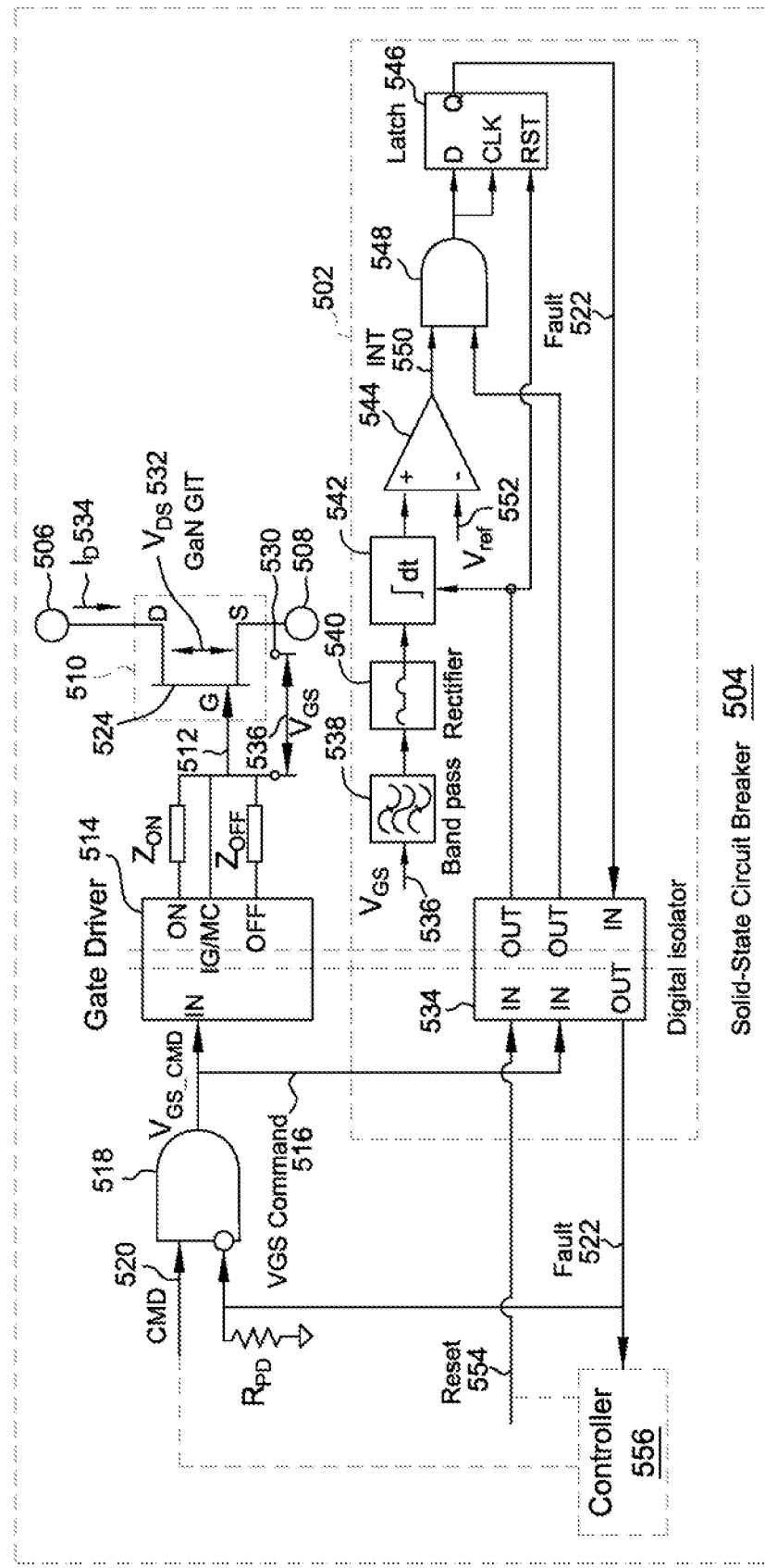
FIG. 5 is a circuit diagram of a solid-state circuit breaker that utilizes an overcurrent fault detector for a HEMT in an example embodiment.
Figure 6:
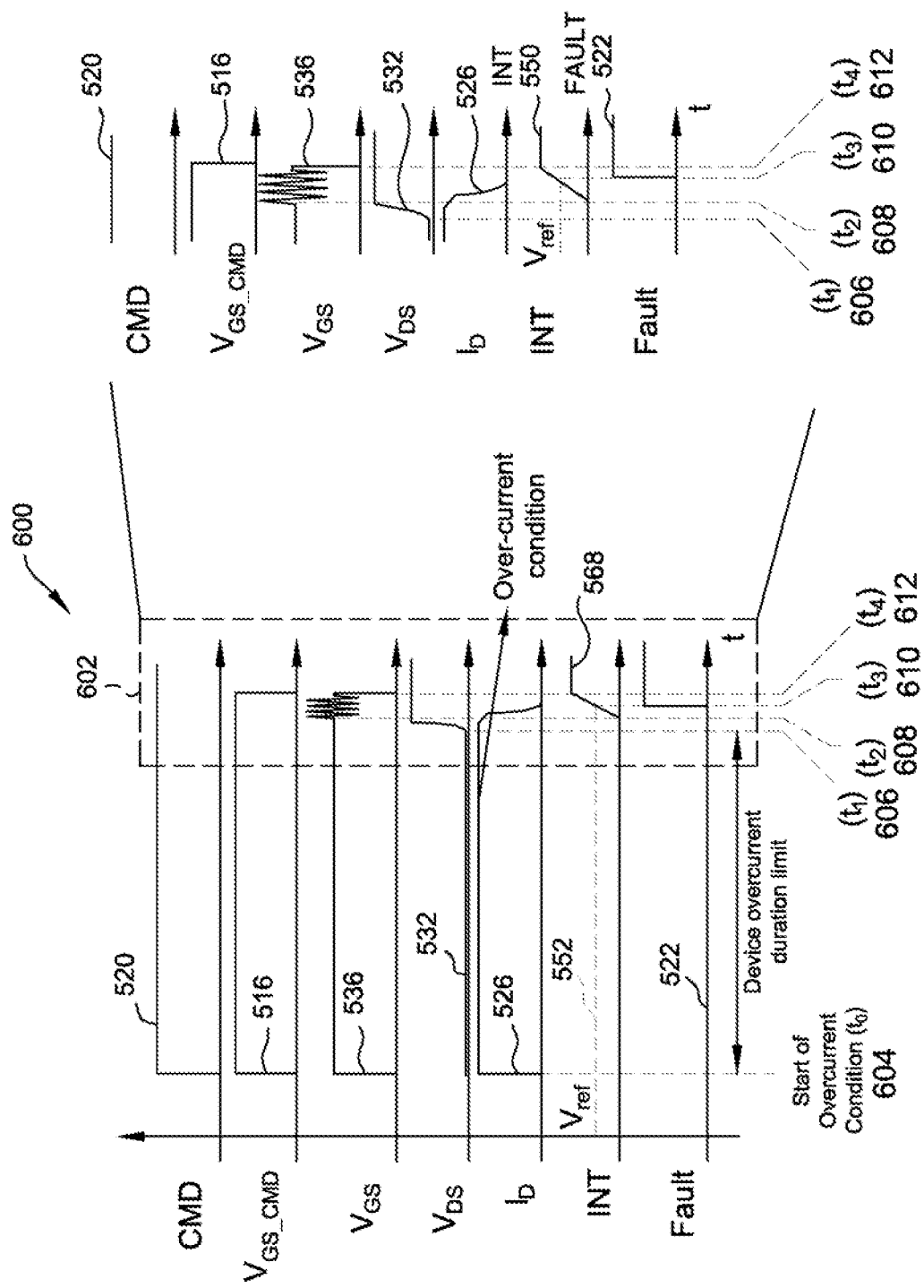
FIG. 6 is a timing diagram of the solid-state circuit breaker of FIG. 5 during an overcurrent fault condition in an example embodiment.

FIG. 5 is a circuit diagram of an overcurrent fault detector 502 for an SSCB 504 in an example embodiment, and FIG. 6 is a timing diagram 600 for signals at the SSCB 504 in an example embodiment. In FIG. 6, a region 602 of the timing diagram 600 is expanded for clarity. Referring to FIG. 5, the SSCB 504 in this embodiment includes a line input connector 506 that couples to a line conductor for an AC power supply and a line output connector 508 that couples to a line conductor for an AC load. For example, the SSCB 504 may be located in an electrical panel at a premise location, with the line input connector 506 for the SSCB 504 electrically coupled to an electrical utility line supply (L) in the electrical panel and the line output connector 508 for the SSCB 504 electrically coupled to a line conductor for an appliance at the premise location. The neutral return is not shown in FIG. 5.

In this embodiment, the SSCB 504 includes one or more HEMTs 510 that selectively couple the line input connector 506 to the line output connector 508 based on a gate drive signal 512 generated by a gate driver 514. The gate drive signal 512 is generated by the gate driver 514 based on a VGS command signal 516, which is an interlocked signal generated by a logic gate 518. When a command signal 520 has a high logic level and a fault signal 522 from the detector 502 has a low logic level, then the VGS command signal 516 and the command signal 520 have the same logic level (e.g., the command signal 520 controls the on/off state of the HEMT 510 and the VGS command signal 516 logically corresponds to the command signal 520). However, when the fault signal 522 has a high logic level (e.g., in response to an overcurrent fault condition at the HEMT 510), then the VGS command signal 516 has a low logic level regardless of the logic level of the command signal 520, which commands the gate driver 514 to turn off the HEMT 510.

In this embodiment, the gate drive signal 512 generated by the gate driver 514 is applied to a gate 524 of the HEMT 510, which allows a drain current 526 to flow between a drain 528 of the HEMT 510 and a source 530 of the HEMT 510. A drain-to-source voltage (VDS) 532 is a voltage between the drain 528 and the source 530 of the HEMT 510.

In this embodiment, the fault detector 502 includes a digital isolator 534, which electrically isolates the fault detector 502 from circuits in the SSCB 504. During operation of the fault detector 502, the differential voltage between the gate 524 and the source 530 of the HEMT 510, referred to as VGS signals 536, is applied to a signal and control path that includes a band-pass filter 538, a rectifier 540, an integrator 542, a comparator 544, and a latch 546, each of which may operate the same or similarly to the band-pass filter 108, the rectifier 202, the integrator 204, the comparator 206, and the latch 208, respectively, as previously described for FIG. 2. In this embodiment, the output of the comparator 544 generates an interrupt signal 550 that is applied to an AND gate 548, and the AND gate forwards the interrupt signal 550 to the latch 546 as long as the VGS command signal 516 applied to the gate driver 514 has a high logic value (e.g., the AND gate forms an interlock for the interrupt signal 550 in this embodiment). The latch 546 in this embodiment latches the fault signal 522 logic level high when the VGS command signal 516 is high and the interrupt signal 550 generated by the comparator 544 is also logic level high. The output of the comparator 544 is logic level high in FIG. 5 when the output value of the integrator 542 applied to the comparator 544 is greater than the reference voltage 552 (e.g., a threshold value) applied to the comparator 544. In this embodiment, a reset signal 554 (e.g., applied by a controller 556) resets the integration time window for the integrator 542, and also clears the latch 546. Clearing the latch 546 resets the fault signal 522 logic level low.

With reference to FIGS. 5 and 6, consider that a line conductor downstream of the SSCB 504 is shorted to neutral, that the reset signal 554 is logic low, and that the fault signal 522 is also logic low. When the command signal 520 is set logic high at time ($t_0$) 604, the VGS command signal 516 also goes logic high, because the fault signal 522 is currently logic low. The gate driver 514 turns on the HEMT 510 in response to the VGS command signal 516 being logic high. The drain current 526 through the HEMT 510 rises to a high value due to the short, generating an overcurrent condition at the HEMT 510. The VDS 532 of the HEMT 510 has a low value at this point in time.

At time ($t_1$) 606, the HEMT 510 has reached its overcurrent duration limit (e.g., based on the junction temperature at the HEMT 510) and the HEMT 510 saturates. In this embodiment, the VDS starts to rise, which is a characteristic of some types of HEMT devices during overcurrent conditions. At time ($t_2$) 608, the drain current 526 begins to fall and the voltage at the gate 524 of the HEMT 510 starts to oscillate, generating an AC component for the VGS signal 536 at a characteristic frequency (e.g., the VGS signal 536 oscillates at a frequency from about 100 MHz to about 200 MHz), which is band-limited by the band-pass filter 538, and is rectified by the rectifier 540. The integrator 542 integrates the output of the rectifier 540, and the result is compared to the reference voltage 552 at the comparator 544. In this example, the VGS signal 536 is oscillating as depicted in FIG. 6, and therefore, the integrator 542 outputs a value that is greater than the reference voltage 552 at the comparator 544. The result is that the comparator 544 sets the interrupt signal 550 logically high at time ($t_3$) 610, which is passed by the AND gate 548 to the latch 546 (e.g., the reset signal 554 is low during analysis). The latch 546 generates and latches the fault signal 522 high based on the high logic level of the interrupt signal 550, which is applied to the logic gate 518 that controls whether the command signal 520 is applied to the gate driver 514. The high logic level of the fault signal 522 at the logic gate 518 overrides the command signal 520, and the VGS command signal 516 goes low, commanding the gate driver 514 to turn off the HEMT 510 at time ($t_4$) 612 and terminate the overcurrent fault condition. The fault signal 522 may also be applied to the controller 556, which may terminate the command signal 520 in response to the overcurrent fault and perform a post-fault recovery process. The post-fault recovery process may include generating the reset signal 554 to reset the integration time window for the integrator 542 and reset the latch 546. Resetting the latch 546 clears the fault signal 522 and enables the controller 556 to re-enable normal operation for sensing overcurrent fault conditions at the HEMT 510.

The embodiments described herein provide sensor-less overcurrent fault detection using HEMTs, thereby providing technical benefits over the art. The technical benefits of the apparatus and method described herein include, at least: (a) facilitating a sensor-less overcurrent fault detection; (b) eliminating or reducing the use of high-bandwidth current sensing circuits; and (c) providing high-speed (e.g., under five microseconds) fault current detection and mitigation.

Example embodiments of apparatus and a method for detecting overcurrent faults are described in detail. The apparatus and method are not limited to the specific embodiments described herein, but rather, components of systems and/or steps of the methods may be utilized independently and separately from other components and/or steps described herein. For example, the method may also be used in combination with other components and are not limited to practice only with the circuits as described herein. Rather, the example embodiment can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An overcurrent fault detector using a High Electron Mobility Transistor (HEMT) operated by a gate driver, the overcurrent fault detector comprising:
   a band-pass filter configured to:
      receive gate-to-source voltage (VGS) signals of the HEMT, wherein the HEMT generates an oscillation in the VGS signals at a characteristic frequency in response to a thermal overload at the HEMT during an overcurrent fault condition; and filter the VGS signals to generate a band-limited version of the VGS signals that suppresses signals outside of the characteristic frequency; and a control circuit configured to:
measure a value of the band-limited version of the VGS signals;
determine if the value is greater than a threshold value; and
generate a fault signal that disables the gate driver and terminates the overcurrent fault condition in response to determining that the value is greater than the threshold value.

2. The overcurrent fault detector of claim 1, wherein the control circuit comprises:
a rectifier configured to convert the band-limited version of the VGS signals to DC signals;
an integrator configured to integrate the DC signals to generate an integrated output of the DC signals over a time frame, wherein the integrated output includes the value;
a comparator configured to determine if the integrated output of the DC signals is greater than the threshold value, and to vary a logic level of a logic signal based on the determination; and
a latch configured to generate and latch the fault signal based on the logic level of the logic signal.

3. The overcurrent fault detector of claim 2, wherein:
the latch is further configured to receive a reset signal, and to clear the fault signal in response to receiving the reset signal.

4. The overcurrent fault detector of claim 2, wherein:
the integrator is further configured to receive a reset signal, and to reset the time frame for integrating the DC signals in response to receiving the reset signal.

5. The overcurrent fault detector of claim 1, wherein:
a bandwidth of the band-pass filter includes a center frequency from about 100 Megahertz to about 300 Megahertz and a pass-band frequency from about 10 Megahertz to about 50 Megahertz around the center frequency.

6. The overcurrent fault detector of claim 1, wherein:
the control circuit is further configured to latch the fault signal until a reset signal is received by the control circuit.

7. The overcurrent fault detector of claim 1, wherein:
the HEMT comprises a Gallium Nitride gate injection transistor HEMT.

8. A method of detecting an overcurrent fault using a High Electron Mobility Transistor (HEMT) operated by a gate driver, method comprising:
receiving gate-to-source voltage (VGS) signals of the HEMT, wherein the HEMT generates an oscillation in the VGS signals at a characteristic frequency in response to a thermal overload at the HEMT during an overcurrent condition;
filtering the VGS signals to generate a band-limited version of the VGS signals that suppresses signals outside of the characteristic frequency;
measuring a value of the band-limited version of the VGS signals;
determining if the value is greater than a threshold value; and
generating a fault signal that disables the gate driver and terminates an overcurrent fault condition in response to determining that the value is greater than the threshold value.

9. The method of claim 8, wherein measuring the value further comprises:
converting the band-limited version of the VGS signals to DC signals; and
integrating the DC signals to generate the value.

10. The method of claim 8, further comprising:
latching the fault signal until a reset signal is received.

11. The method of claim 8, wherein filtering the VGS signals further comprises:
filtering the VGS signals to generate the band-limited version of the VGS signals having a bandwidth that includes a center frequency from about 100 Megahertz to about 300 Megahertz and a pass-band frequency from about 10 Megahertz to about 50 Megahertz around the center frequency.

12. A solid-state circuit breaker for an Alternating Current (AC) power system, the solid-state circuit breaker comprising:
a line input connector;
a line output connector;
a High Electron Mobility Transistor (HEMT) having a gate, a drain, and a source, wherein the drain and source selectively form a conduction path between the line input connector and the line output connector based on a drive signal applied between the gate and the source;
a gate driver configured to generate the drive signal based on a gate command signal;
a band-pass filter configured to:
receive gate-to-source voltage (VGS) signals of the HEMT, wherein the HEMT generates an oscillation in the VGS signals at a characteristic frequency in response to a thermal overload at the HEMT during an overcurrent fault condition; and
filter the VGS signals to generate a band-limited version of the VGS signals that suppresses signals outside of the characteristic frequency; and
a control circuit configured to:
measure a value of the band-limited version of the VGS signals;
determine if the value is greater than a threshold value; and
generate a fault signal that disables the gate driver to disconnect the line input connector from the line output connector and terminate the overcurrent fault condition in response to determining that the value is greater than the threshold value.

13. The solid-state circuit breaker of claim 12, wherein the control circuit comprises:
a rectifier configured to convert the band-limited version of the VGS signals to DC signals;
an integrator configured to integrate the DC signals and generate an integrated output of the DC signals over a time frame, wherein the integrated output includes the value;
a comparator configured to determine if the integrated output of the DC signals is greater than the threshold value, and to vary a logic level of a logic signal based on the determination; and
a latch configured to generate and latch the fault signal based on the logic level of the logic signal.

14. The solid-state circuit breaker of claim 13, wherein:
the latch is further configured to receive a reset signal, and to clear the fault signal in response to receiving the reset signal.

15. The solid-state circuit breaker of claim 13, wherein:
the integrator is further configured to receive a reset signal, and to reset the time frame for integrating the DC signals in response to receiving the reset signal.

16. The solid-state circuit breaker of claim 12, wherein:
a bandwidth of the band-pass filter includes a center frequency from about 100 Megahertz to about 300 Megahertz and a pass-band frequency from about 10 Megahertz to about 50 Megahertz around the center frequency.

17. The solid-state circuit breaker of claim 12, wherein:
the control circuit is further configured to latch the fault signal until a reset signal is received by the control circuit.

18. The solid-state circuit breaker of claim 12, wherein:
the HEMT comprises an enhancement mode HEMT.

19. The solid-state circuit breaker of claim 12, wherein:
the HEMT comprises a Gallium Nitride gate injection transistor HEMT.

20. The solid-state circuit breaker of claim 12, wherein:
the HEMT comprises a normally off HEMT.

* * * * *